(12) United States Patent
Kanno (10) Patent No.: US 7,590,919 B2
(45) Date of Patent: Sep. 15, 2009

(54) APPARATUS, METHOD AND COMPUTER PROGRAM PRODUCT FOR READING INFORMATION STORED IN STORAGE MEDIUM, AND STORAGE MEDIUM FOR STORING INFORMATION BASED ON CHARGE AMOUNT

(75) Inventor: Shinichi Kanno, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 504 days.

(21) Appl. No.: 11/468,621

(22) Filed: Aug. 30, 2006

(65) Prior Publication Data

US 2007/0130496 A1    Jun. 7, 2007

(30) Foreign Application Priority Data

Dec. 5, 2005    (JP) .............................. 2005-350819

(51) Int. Cl.
*G11C 29/00* (2006.01)
(52) U.S. Cl. ..................... 714/769; 714/763
(58) Field of Classification Search ................ 714/763, 714/769
See application file for complete search history.

(56) References Cited

U.S. PATENT DOCUMENTS

| | | | | |
|---|---|---|---|---|
| 5,051,998 | A * | 9/1991 | Murai et al. ................ | 714/762 |
| 5,459,742 | A * | 10/1995 | Cassidy et al. .............. | 714/769 |
| 5,600,662 | A * | 2/1997 | Zook .......................... | 714/769 |
| 6,697,992 | B2 * | 2/2004 | Ito et al. ..................... | 714/763 |
| 6,799,291 | B1 * | 9/2004 | Kilmer et al. ............... | 714/722 |
| 7,107,513 | B1 * | 9/2006 | Yamauchi .................... | 714/795 |
| 7,363,553 | B2 * | 4/2008 | Cai et al. ..................... | 714/709 |
| 2002/0018389 | A1 * | 2/2002 | Ito et al. ..................... | 365/222 |
| 2004/0148557 | A1 * | 7/2004 | Ito et al. ..................... | 714/763 |
| 2005/0066260 | A1 * | 3/2005 | Natori ......................... | 714/795 |
| 2005/0154955 | A1 * | 7/2005 | Cai et al. ..................... | 714/746 |
| 2006/0004952 | A1 * | 1/2006 | Lasser ......................... | 711/103 |
| 2006/0155919 | A1 * | 7/2006 | Lasser et al. ................ | 711/103 |
| 2007/0130496 | A1 | 6/2007 | Kanno | |
| 2007/0174740 | A1 | 7/2007 | Kanno | |

OTHER PUBLICATIONS

U.S. Appl. No. 12/393,654, filed Feb. 26, 2009, Fukutomi, et al.
U.S. Appl. No. 12/396,006, filed Mar. 2, 2009, Sato, et al.
U.S. Appl. No. 12/395,811, filed Mar. 2, 2009, Fukutomi, et al.
U.S. Appl. No. 12/398,608, filed Mar. 5, 2009, Fukutomi, et al.

* cited by examiner

*Primary Examiner*—M. Mujtaba K Chaudry
(74) *Attorney, Agent, or Firm*—Oblon, Spivak, McClelland, Maier & Neustadt, L.L.P.

(57) ABSTRACT

A reproducing apparatus includes a storage unit including a plurality of memory elements each capable of holding an electric charge, each memory element indicating a 2-bit code which is related to each other so that the Hamming distance between adjacent codes is unity in four ranges determined by a charge amount with respect to three threshold values with the minimum or maximum value thereof as a fixed value; a reading unit that reads each 2-bit code by the charge amount which is held in each memory element using the three threshold values corresponding to each memory element; an error detector that detects whether a first bit string consisting of right bits of the 2 bit codes read or a second bit string consisting of left bits of the 2 bit codes read has an error; and a threshold changing unit that, upon detection of the error, changes a threshold value corresponding to the bit string having the error other than a fixed threshold value to secure a correct bit string.

11 Claims, 9 Drawing Sheets

BEFORE DISCHARGE

FIG.3B

IN FIRST TIME AFTER DISCHARGE

FIG.3C

IN SECOND TIME AFTER DISCHARGE

FIG.4A

BEFORE DISCHARGE

FIG.4B

IN FIRST TIME AFTER DISCHARGE

FIG.4C

IN SECOND TIME AFTER DISCHARGE

BEFORE DISCHARGE

FIG.8B

IN FIRST TIME AFTER DISCHARGE

FIG.8C

IN SECOND TIME AFTER DISCHARGE

APPARATUS, METHOD AND COMPUTER PROGRAM PRODUCT FOR READING INFORMATION STORED IN STORAGE MEDIUM, AND STORAGE MEDIUM FOR STORING INFORMATION BASED ON CHARGE AMOUNT

CROSS-REFERENCE TO RELATED APPLICATIONS

This application is based upon and claims the benefit of priority from the prior Japanese Patent Application No. 2005-350819, filed on Dec. 5, 2005; the entire contents of which are incorporated herein by reference.

BACKGROUND OF THE INVENTION

1. Field of the Invention

This invention relates to an apparatus, a method, and a computer program product for reading information stored in a storage medium, and a storage medium where information is stored in accordance with charge amount.

2. Description of the Related Art

In recent years, a semiconductor memory element such as a flash memory for storing information in accordance with the charge amount held therein are widely known. Also, a multi-valued memory technique for storing the information of 2 bits or more by setting a plurality of threshold values of the charge amount has been developed.

The memory element of charge accumulation type is discharged with time and every read operation due to parasitic resistance of the memory element and input resistance of a sense amplifier and the like. Since the accumulated charge amount is reduced by natural discharge also even when a read or write operation is not performed for a long time the situation in which the information cannot be read is liable to occur after power is not switched on for a long time especially with regard to a nonvolatile memory. In the multi-valued memory, on the other hand, the decreased output of the memory element by discharge has so great an effect that the number of read operations is limited.

In view of this, a technique has been proposed in which before the situation occurs in which the information cannot be read, the output voltage of the memory element is detected and when the output voltage is reduced, the information is stored again by the refresh operation, thereby the information is maintained to be read correctly (see U.S. Pat. No. 5,909,449, for example).

The method described in U.S. Pat. No. 5,909,449, however, poses a problem that when a long time has passed from a write operation and the output voltage of the memory element has greatly decreased, the information to be written by the refresh operation cannot be read from the memory elements. Therefore, the memory elements that have passed a long time from the write operation cannot be refreshed, with the result that the information cannot be read correctly.

SUMMARY OF THE INVENTION

According to one aspect of the present invention, a reproducing apparatus includes a storage unit including a plurality of memory elements each capable of holding an electric charge, each memory element indicating a 2-bit code which is related to each other so that the Hamming distance between adjacent codes is unity in four ranges determined by a charge amount with respect to three threshold values with the minimum or maximum value thereof as a fixed value; a reading unit that reads each 2-bit code by the charge amount which is held in each memory element using the three threshold values corresponding to each memory element; an error detector that detects whether a first bit string consisting of right bits of the 2 bit codes read or a second bit string consisting of left bits of the 2 bit codes read has an error; and a threshold changing unit that, upon detection of the error, changes a threshold value corresponding to the bit string having the error other than a fixed threshold value to secure a correct bit string.

According to another aspect of the present invention, a storage medium includes a plurality of memory elements each capable of holding an electric charge, each memory element indicating a code of two bits which is related to each other so that the time before the occurrence of a discharge-caused code read error exceeding a first threshold value that is a minimum threshold value or a maximum threshold value from the time of storing the code is longer than the time before the occurrence of a discharge-caused code read error exceeding other than the first threshold value from the time of storing the code and so that the Hamming distance between adjacent codes is unity in four ranges determined by a charge amount with respect to three threshold values of the charge amount.

According to still another aspect of the present invention, a reproducing method includes reading each 2-bit code by a charge amount which is held by each of a plurality of memory elements included in a storage unit and capable of holding an electric charge, using three threshold values having a fixed minimum value or a fixed maximum value corresponding to each of the memory elements indicating the 2-bit codes related to each other so that the Hamming distance between adjacent codes is unity in four ranges determined by the charge amount with respect to the three threshold values; detecting whether a first bit string consisting of right bits of the 2 bit codes read or a second bit string consisting of left bits of the 2 bit codes read has an error; and upon detection of the error, changing a threshold value corresponding to the bit string having the error other than a fixed threshold value to secure a correct bit string.

According to still another aspect of the present invention, a computer program product causes a computer to perform the reproducing method according to the present invention.

DETAILED DESCRIPTION OF THE INVENTION

Exemplary embodiments of a storage medium, a reproducing apparatus, a reproducing method, and a reproducing program according to the present invention are described in detail below with reference to the accompanying drawings.

A reproducing apparatus according to a first embodiment detects an error of the read-out 2-bit information for each bit, changes a threshold value for determining a code stored in a memory element on detection of an error, and then reads the information again.

Figure 1:
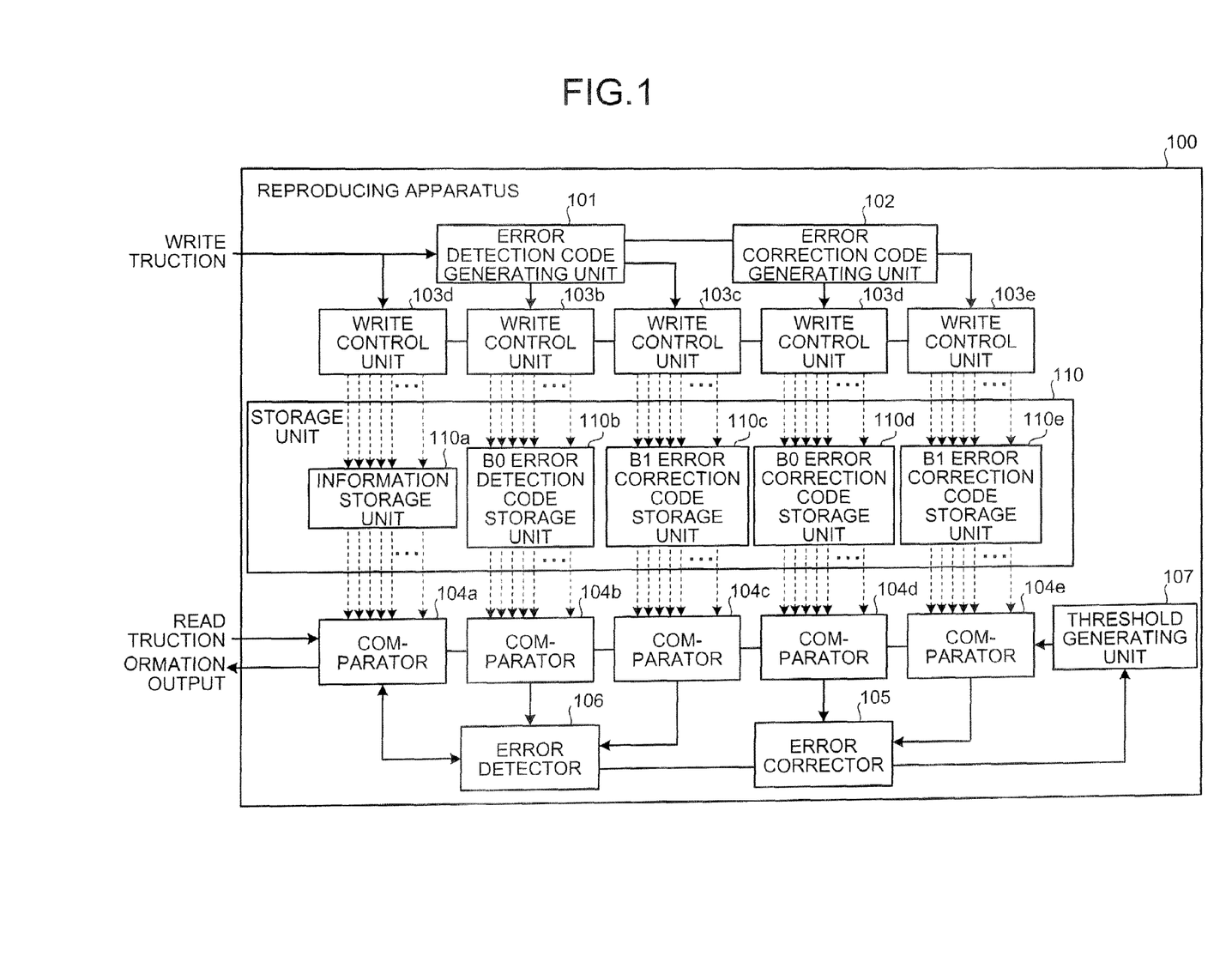
FIG. 1 is a block diagram showing a configuration of a reproducing apparatus according to a first embodiment.

FIG. 1 is a block diagram showing a configuration of a reproducing apparatus 100 according to the first embodiment. As shown in FIG. 1, the reproducing apparatus 100 includes a storage unit 110, an error detection code generating unit 101, an error correction code generating unit 102, write control units 103a to 103e, comparators 104a to 104e, an error corrector 105, an error detector 106, and a threshold generating unit 107.

The storage unit 110 is a memory element for storing information in accordance with the magnitude relation between the charge amount and a predetermined charge amount threshold value, and is, for example, a generally-used semiconductor memory such as a flash memory or a DRAM (dynamic random access memory). The storage unit 110 is four-state memory element having three threshold values to store four values "00," "01", "11", "10."

The storage unit 110 includes an information storage unit 110a, a B0 error detection code storage unit 110b, a B1 error detection code storage unit 110c, a B0 error correction code storage unit 110d, and a B1 error correction code storage unit 110e. The information storage unit 110a has a plurality of memory cells each of which is a four-state memory element to store the very information stored in the storage unit 110.

Each of the B0 error detection code storage unit 110b and the B1 error detection code storage unit 110c is a storage unit including a memory cell which is a four-state memory element to store an error detection code corresponding to the information to be stored.

In the process, the B0 error detection code storage unit 110b stores the error detection code calculated only from right bit (hereinafter referred to as the "bit B0") of the 2-bit code indicating the information stored. Similarly, the B1 error detection code storage unit 110c stores the error detection code calculated only from the left bit (hereinafter referred to as the "bit B1") of the 2-bit code indicating the information stored.

Each of the B0 error correction code storage unit 110d and the B1 error correction code storage unit 110e is a storage unit including a memory cell which is a four-state memory element to store an error correction code corresponding to the information stored. In the process, the B0 error correction code storage unit 110d and the B1 error correction code storage unit 110e store the error correction codes calculated from the bits B0, B1, respectively.

Figure 2A:
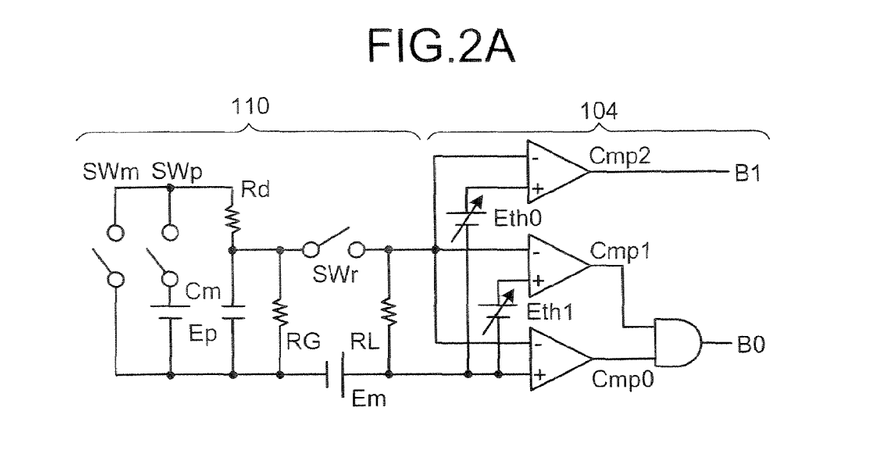
FIGS. 2A to 2C are diagrams each illustrating an equivalent circuit of a memory element constituting a storage unit according to the first embodiment.
Figure 2B:
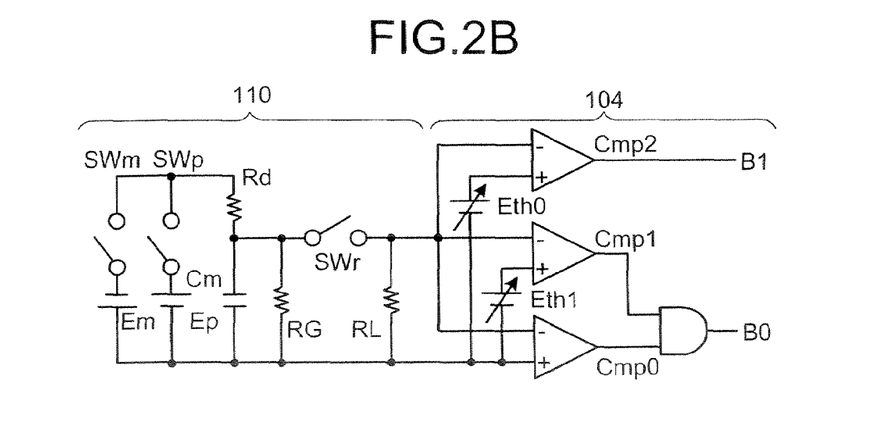
Figure 2C:
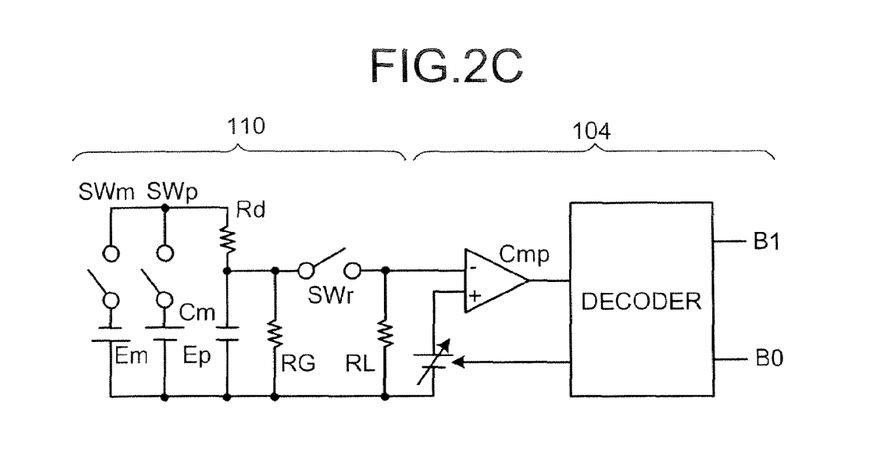

FIGS. 2A to 2C are diagrams each illustrating an equivalent circuit of the memory elements constituting the storage unit 110 according to the first embodiment. FIGS. 2A to 2C show equivalent circuits of a four-state memory element, any of which can be used as the storage unit 110 according to this embodiment.

As shown in FIGS. 2A to 2C, the equivalent circuits have two power supplies Ep and Em capable of generating current of different polarities and can accumulate the positive and negative charge in a capacitor Cm in common.

Each right stage in FIGS. 2A to 2C corresponds to an equivalent circuit of one of the comparators 104a to 104e, while each left stage in FIGS. 2A to 2C corresponds to an equivalent circuits of the memory element for accumulating the charge. Although each of FIGS. 2A to 2C shows only one memory element, the actual storage unit 110 has a plurality of similar memory elements in parallel. Specifically, a part of the plurality of the memory elements corresponds to the information storage unit 110a, and the remaining part corresponds to the B0 error detection code storage unit 110b, the B1 error detection code storage unit 110c, the B0 error correction code storage unit 110d and the B1 error correction code storage unit 110e, the whole of which constitutes the storage unit 110.

In the four-state memory element, the accumulated charge amount is compared with three threshold values by a comparator and thus the 2-bit information of bits B0 and B1 can be output. In this way, the four-state information (01, 00, 10, 11) is stored.

The memory element, which is provided as the equivalent circuit as shown in FIGS. 2A to 2C, is, for example, an EEP-ROM (Electrically Erasable Programmable Read-Only Memory), a flash memory, and a DRAM. Such a memory element expresses information by an amount of the charge accumulated in the capacitor Cm shown in FIGS. 2A to 2C. Resistor Rd shown in FIGS. 2A to 2C has a comparatively low resistance value, while resistor RG indicates a parasitic resistance generated by the device structure and has a high resistance value.

The information is stored in this memory element by turning on a switch SWm or SWp, and thus charging a predefined amount of charge in the capacitor Cm. When a four-valued code (2 bits) is stored, for example, the charge amount is defined as follows: the code "00" indicates negative charge; the code "01" indicates a charge amount of 100%, i.e., the fully accumulated positive charge; the code "11" indicates a charge amount of 0%; and the code "10" indicates a charge amount of 50%. Then, by adjusting the time length while the switch SWm or SWp is turned on in accordance with the code to be stored, the accumulated charge amount is controlled thereby to store the information.

The charge amount assigned to each code is not limited to the aforementioned ratio, but may be changed upward or downward in accordance with the characteristic of the memory element. Also, control of the charge amount is not limited to the above example, but any control can be employed as far as a predetermined charge amount is accumulated.

In a read operation, the switch SWr is turned on and the amount of charge is compared with a predetermined threshold voltage thereby to determine each code. Upon complete determination, the switch SWr is turned off. In the configuration shown in FIG. 2C, a required threshold value is set from the decoder and used for comparison by the comparator Cmp. Also, as described later, one of the three threshold values can be used as a fixed value such as "0," and therefore the other two threshold values Eth0, Eth1 are predetermined and used for comparison.

According to the first embodiment, the information are stored in or read from a multiplicity of memory elements in parallel. When the information is stored in many memory elements, the characteristics are varied from one memory element to another due to the reason of fabrication.

Figure 3A:
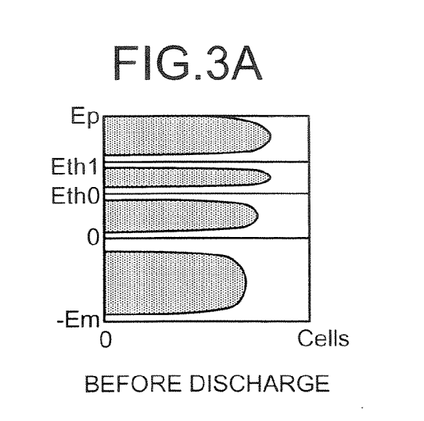
FIGS. 3A to 3C are diagrams illustrating an example of charge amount distribution of a memory element according to the first embodiment.
Figure 3B:
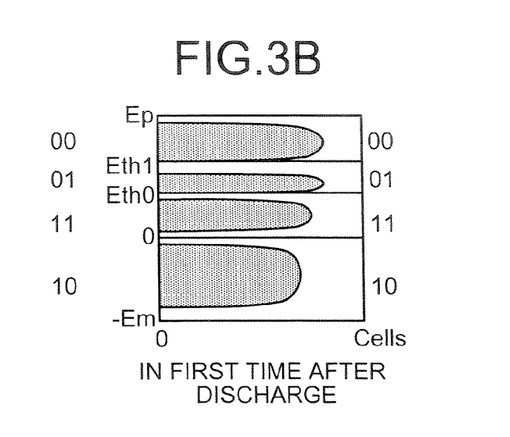
Figure 3C:
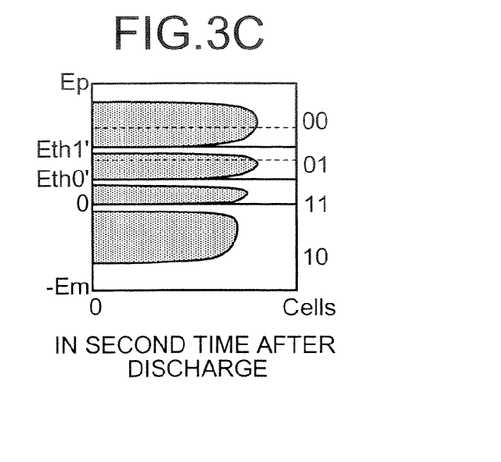
Figure 4A:
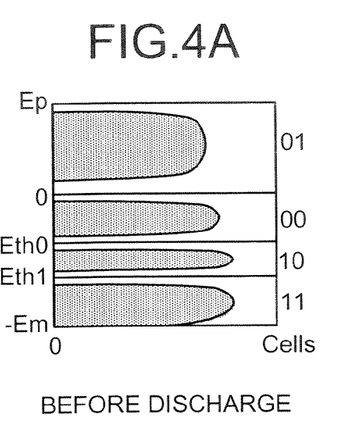
FIGS. 4A to 4C are diagrams illustrating another example of charge amount distribution of a memory element according to the first embodiment.
Figure 4B:
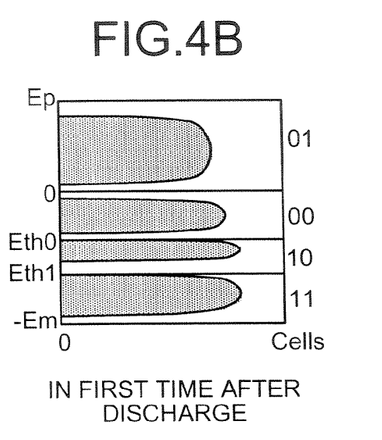
Figure 4C:
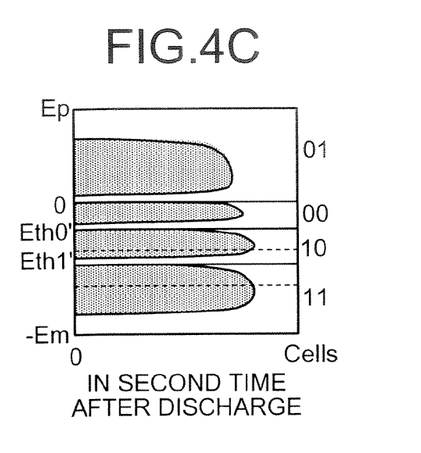

FIGS. 3A to 3C are diagrams illustrating an example of charge amount distribution of the memory element according to the first embodiment. FIGS. 4A to 4C are diagrams illustrating another example of charge amount distribution of the memory element. Each of FIGS. 3A and 4A shows a charge amount distribution immediately after a write operation (i.e., discharge); each of FIGS. 3B and 4B shows a charge amount distribution upon lapse of a certain time after discharge; and each of FIGS. 3C and 4C shows a charge amount distribution upon further lapse of time after discharge. Reference characters Eth0, Eth1 designate the threshold values of the charge amount.

As shown in FIGS. 3A to 3C and 4A to 4C, the charge amount of each memory element immediately after storing the information is distributed over a certain range, and therefore the threshold voltage for separating each code is determined taking this distribution into consideration. With the lapse of time or the reading of information, however, the capacitor Cm is gradually discharged due to the resistors RG, RL, until the output voltage of some memory elements approaches the threshold voltage as shown in FIGS. 3B and 4B. If the output voltage of a memory element decreases below the threshold value, the value of the code of the particular memory element is determined erroneously.

According to the first embodiment, upon occurrence of an information read error, the value of the threshold voltage is changed and the read operation is performed again. This operation is repeated until the information can be read out correctly. In this way, the information can be read correctly even in spite of the discharge due to the lapse of time.

FIGS. 3A to 3C and 4A to 4C show examples in which one of the threshold values is fixed to "0". This is because if the charge amount in a long time after discharge is used as a threshold value, the output voltage cannot exceed the particular threshold value due to the discharge. In other words, the impossibility of determining the codes "10" and "11" on both sides of the threshold value can be infinitely reduced.

FIGS. 3A to 3C and 4A to 4C show examples in which the charge amount in a long time after discharge is "0." When the charge amount in a long time after discharge is other than "0," the particular value can be set as one of the threshold values.

FIGS. 3A to 3C show an example in which the minimum one of the three threshold values has a threshold value "0" and the other two threshold values Eth0, Eth1 are set to values larger than "0." FIGS. 4A to 4C show another example in which the maximum one of the three threshold values is "0." and the other two threshold values Eth0, Eth1 are set to values smaller than "0."

The charge amount distribution in FIGS. 3C and 4C show that the threshold values Eth0, Eth1 are changed to the Eth0', Eth1', respectively. This indicates a case in which if the information read out has an error, a threshold voltage, different from the threshold values Eth0, Eth1 used at the time of reading the information, are generated by a threshold generating unit 107 described later.

Also, as shown in FIGS. 3A to 3C and 4A to 4C, according to the first embodiment, the codes corresponding to the charge amount are set in such a manner that the Hamming distance between adjacent ones of the codes arranged in the ascending order of magnitude of the charge amount is one (1). As a result, the threshold value for determining the bit B1, for example, can be limited to Eth0. At the same time, one of the threshold values for determining the bit B0 is fixed to "0," and therefore the threshold value capable of being correctly read can be detected simply by changing the other threshold value Eth1.

The error detection code generating unit 101 generates an error detection code for information at the time of writing the information. As a method of generating an error detection code, any conventional method using the CRC (Cyclic Redundancy Check) code (CRC 16, CRC 32, etc.) or the check sum can be employed as far as a detection code is capable of detecting whether the information to be stored is erroneous or not.

The error detection code generating unit 101 generates an error detection code for each bit (bit B0, B1) making up the 2-bit code of the information. When the error detection code of bit B0 is calculated, for example, the bit B0 is retrieved from the 2-bit code indicating a plurality of pieces of information stored in the information storage unit 110a, the error detection code is calculated from a plurality of bits retrieved and stored in the B0 error detection code storage unit 110b. As a result, the bit B1 group and the bit B0 group can be checked independently whether or not it contains an error.

The error correction code generating unit 102 generates an error correction code from information to be stored combined with the error detection code generated by the error detection code generating unit 101 at the time of the information write process. As a method of generating the error correction code, any of the conventional methods may be used such as BCH (Bose-Chaudhuri-Hocquenghem) code or the RS (Reed-Solomon) code and the like as far as the method can correct error immediately.

The error correction code generating unit 102 generates an error correction code for each bit (bits B0, B1) making up the 2-bit code indicating information. In calculating the error correction code of the bit B0, for example, the bit B0 is retrieved from the 2-bit code indicating information including information to be stored and the error detection code generated by the error detection code generating unit 101, and the error correction code is calculated from a plurality of retrieved bits and stored in the B0 error detection code storage unit 110b.

Also, the reproducing apparatus 100 may alternatively be configured only to detect an error but not to correct the error. In such a case, the error correction code generating unit 102, the error correction code storage unit 110d and the error corrector 105 described later are not required.

The error detection code and the error correction code generated by the error detection code generating unit 101 and the error correction code generating unit 102 are stored in the memory element group making up the storage unit 110 together with the information stored. Assuming that the CRC 16 is used for error detection and an error is corrected up to 4 bits including the correction code using the BCH code, for example, 16 bits are required for error detection and 48 bits for error correction. Specifically, the storage capacity required of the error detection code storage unit 110b is 16 bits, and the storage capacity required of the error correction code storage unit 110d is 48 bits.

In storing the information of 2048 bits in the information storage unit 110a, the memory element group making up the storage unit 110 requires 2112 (=2048+16+48) bits as a capacity for storing information to be stored, the error detection code and the error correction code.

By arranging these storage units 110 in parallel and sharing the configuration other than the storage units 110, a large-capacity storage device can be configured. Specifically, a plurality of memory element groups each to store information to be stored, the error detection code and the error correction code as one unit (2112 bits, for example) are arranged in parallel, and the write control units 103a to 103e and the comparators 104a to 104e are connected by being switched at the time of write and read operations.

The write control units 103a to 103e control process of writing information, an error detection code and an error correction code to the storage unit 110. The write control units

103*a*, 103*b*, 103*c*, 103*d*, 103*e* execute the process of writing in the information storage unit 110*a*, the B0 error detection code storage unit 110*b*, the B1 error detection code storage unit 110*c*, the B0 error correction code storage unit 11*d*, and the B1 error correction code storage unit 110*e*, respectively.

The comparators 104*a* to 104*e* read information from the storage unit 110 by comparing the three threshold voltages with the charge amount stored in the storage unit 110. In the description that follows, the three threshold values are collectively called threshold group. As an initial value of the threshold voltage, a value by which the code can be correctly identified immediately after the write operation is used.

The comparators 104*a*, 104*b*, 104*c*, 104*d*, 104*e* read the information from the information storage unit 110*a*, the B0 error detection code storage unit 110*b*, the B1 error detection code storage unit 110*c*, the B0 error correction code storage unit 110*d*, and the B1 error correction code storage unit 110*e*, respectively.

When the presence of an error in the information read is detected by the error detector 106 described later, the comparators 104*a* to 104*e* read information by comparing the threshold voltage newly generated by the threshold generating unit 107 described later with the charge amount stored in the storage unit 110 again.

The error corrector 105 executes the process of correcting an error of information including information read from the information storage unit 110*a* and an error detection code read from the B0 error detection code storage unit 110*b* and the B1 error detection code storage unit 110*c* using an error correction code read by the comparator 104*d* or 104*e*. Any conventional error correction technique using the BCH code or the RS code and the like can be used as the error correction.

The error detector 106 determines whether an error is included in the information read by the comparator 104*a* and corrected by the error corrector 105, using the error detection code read by the comparators 104*b*, 104*c* and corrected by the error corrector 105.

In the process, the error detector 106 can detect an error for each code bit. Specifically, with regard to bit B0, the error in the bit B0 of the code indicating the information can be detected using the error detection code stored in the B0 error detection code storage unit 110*b*. Similarly, with regard to bit B1, the error in the bit B1 of the code indicating the information can be detected using the error detection code stored in the B1 error detection code storage unit 110*c*.

In error detection, any of the conventional error detection techniques such as the CRC code and the check sum and the like can be used. In the configuration free of error detection, on the other hand, the error detector 106 determines whether the information read by the comparator 104*a* contains an error or not.

In the threshold generating unit 107, upon detection of the presence of an error in an arbitrary bit of the code indicating the information read by the error detector 106, the threshold value corresponding to the error-containing bit is changed to a value different from the value in the threshold group used for reading thereby to generate a new threshold group containing three threshold values.

Assume, for example, that the charge and the code correspond to each other as shown in FIGS. 3A to 3C, the only threshold value used for determining the bit B1 is Eth0, and upon detection of an error in the bit B1, therefore, only Eth0 is changed to generate a new threshold group. On the other hand, two threshold values are used for determining the bit B0, but one of them is a fixed value "0." Accordingly, on detection an error in the bit B0, therefore, only the other threshold value Eth1 is changed to generate a new threshold group. In this way, only one threshold value corresponding to the error-containing bit is changed, and therefore the threshold detection process capable of reading the correct information can be executed at higher speed.

The threshold generating unit 107 generates an initial value of the threshold voltage capable of correctly determining the code immediately after the write operation in the initial reading session.

Figure 5:
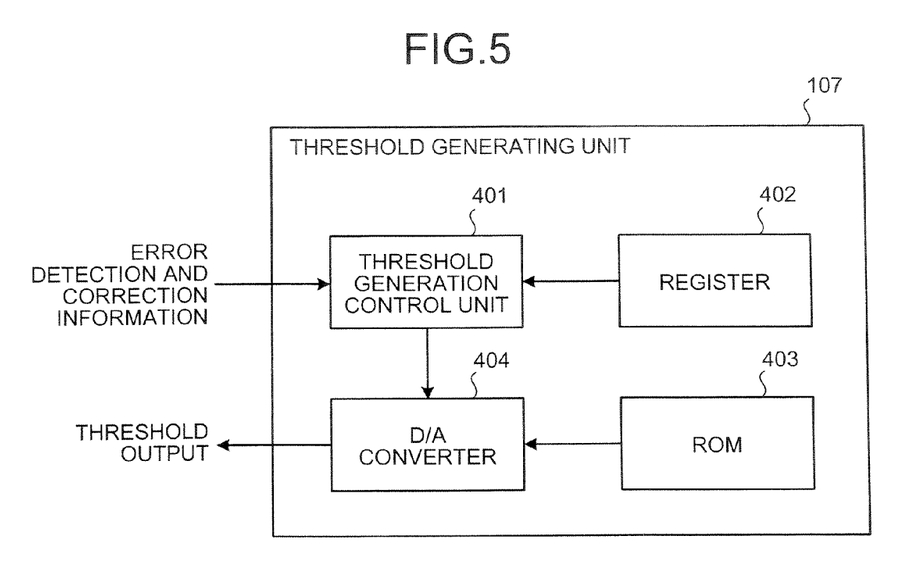
FIG. 5 is a block diagram of a detailed configuration of a threshold generating unit.

FIG. 5 is a block diagram of a detailed configuration of the threshold generating unit 107. As shown in FIG. 5, the threshold generating unit 107 includes a threshold generation control unit 401, a register 402, a ROM (Read-Only Memory) 403, and a D/A (Digital/Analog) converter 404.

The threshold generation control unit 401 is a control unit for controlling the threshold generating process. The register 402 is a storage unit for storing the value of the threshold voltage currently in use. The ROM 403 is a storage unit for storing the initial value of a predetermined threshold voltage. The storage unit for storing the initial value of the threshold voltage may be configured externally to the threshold generating unit 107. The D/A converter 404 converts the value of the threshold voltage stored in the ROM 403 into an analog signal so as to be used for comparison by the comparators 104*a* to 104*c* and output the converted value.

Upon detection of an error, the threshold generation control unit 401 refers to the set value of the current threshold voltage stored in the register 402, generates and stores a value different from the set value and stores in the register 402.

To generate the threshold voltage by the threshold generation control unit 401, any method can be used as far as a threshold voltage different from the threshold voltage used for error detection can be generated.

In the case shown in FIGS. 3A to 3C, for example, the thresholds Eth0, Eth1 assume a value between the minimum value 0 and the maximum value Ep of the charge amount, and therefore a configuration can be employed to generate an intermediate value between them which is different from the threshold voltage used when the error is detected.

In view of the fact that the threshold value Eth0 is smaller than the threshold value Eth1, a configuration may be employed to use a value between the minimum value 0 of the charge amount and the threshold value Eth1 which is different from the threshold voltage used when the error is detected.

On the other hand, in view of the fact that the threshold value Eth1 is larger than the threshold value Eth0, a configuration may be employed to use a value between the threshold value Eth0 and the maximum value Ep of the charge amount which is different from the threshold voltage used when the error is detected.

The threshold generation control unit 401 can determine a new threshold voltage from the value range described above by random extraction, by adding or subtracting a predetermined value or any other method.

Further, taking into consideration the characteristic of the absolute value of the charge amount decreasing with the discharge, a value smaller than the threshold voltage used when the error is detected may be calculated, for example, in the case of FIGS. 3A to 3C. In the process, an appropriate value corresponding to the lapsed time and the discharge characteristic can be subtracted.

In the case of FIGS. 4A to 4C, on the other hand, the voltage polarity is different from that in FIGS. 3A to 3C, and therefore a configuration may be employed to calculate a value larger than the threshold voltage used when the error is detected. Also, as in the case of FIGS. 3A to 3C, an appropriate value may be added in accordance with the elapsed time and the discharge characteristic.

In applications for error detection and error correction, the read operation of the memory elements included in the memory element group is performed the same number of times. As a result, the discharge amount of the accumulated charge is considered substantially the same among the memory elements of the memory element group, and therefore the same threshold voltage is used for the memory elements in the same memory element group.

Figure 6:
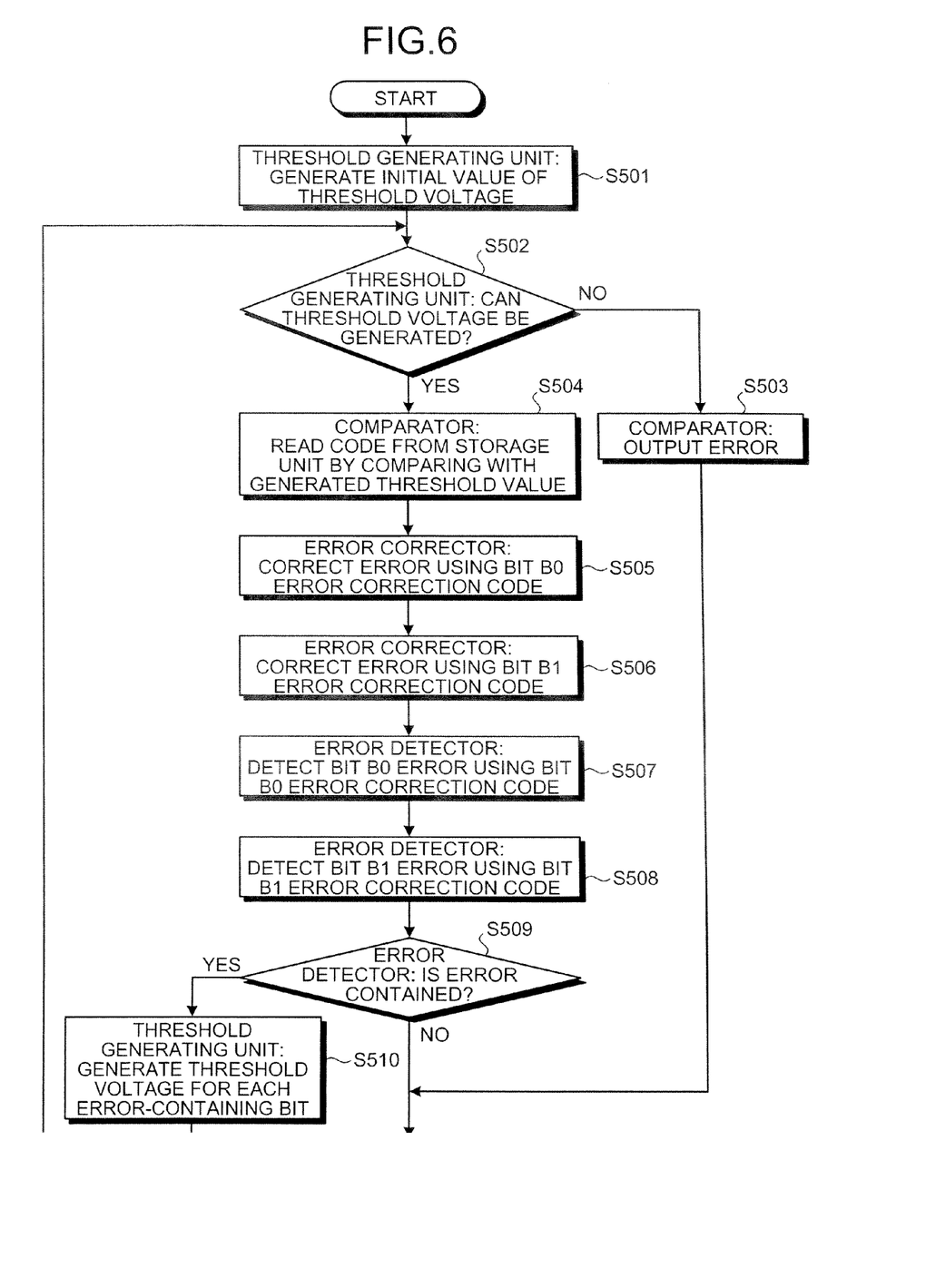
FIG. 6 is a flowchart showing the general flow of an information reading process according to the first embodiment.

Next, an information reading process executed by the reproducing apparatus 100 according to the first embodiment having the aforementioned configuration will be explained below. FIG. 6 is a flowchart showing the general flow of the information reading process according to the first embodiment.

First, the threshold generating unit 107 generates by acquiring from the ROM 403 the initial value of the threshold voltage used for comparison by the comparators 104a to 104e (step S501).

Next, the threshold generating unit 107 determines whether a threshold voltage can be generated or not (step S502). When the threshold voltage cannot be generated (NO at step S502), the comparators 104a to 104e output a signal indicating the occurrence of an error (step S503) thereby to end the information reading process.

In this case, no generation of a threshold voltage is represented by a case in which although a new threshold voltage is generated by subtracting the threshold voltage, for example, the threshold voltage has reached zero and therefore no new threshold voltage cannot be generated.

When the threshold voltage can be generated (YES at step S502), on the other hand, the comparators 104a to 104e compare the particular threshold value with the threshold value generated by the threshold generating unit 107 thereby to read the code from the storage unit 110 (step S504).

Next, the error corrector 105 executes the process of correcting the error of bit B0 using the error correction code of bit B0 read by the comparator 104d (step S505). Then, the error corrector 105 executes the process of correcting the error of bit B1 using the error correction code of bit B1 read by the comparator 104e (step S506).

The error corrector 105 corrects the information, which is a combination of the information read by the comparator 104a from the information storage unit 11a and the error detection code read by the comparators 104b and 104c from the B0 error detection code storage unit 110b and the B1 error detection code storage unit 110c.

Next, the error detector 106 detects an error of the B0 bit obtained as the result of error correcting process by the error corrector 105 using the error detection code of bit B0 (step S507). Then, the error detector 106 detects an error of bit B1 using the error detection code of bit B1, obtained as the result of the error correcting process by the error corrector 105 (step S508).

Specifically, the error detector 106 determines whether an error is contained in the information read by the comparator 104a and corrected by the error corrector 105, using the error detection code read by the comparators 104b, 104c and corrected by the error corrector 105.

Then, the error detector 106 determines whether an error is contained in bit B0 or bit B1 (step S509), and when an error is so contained (YES at step S509), the threshold generating unit 107 generates a threshold voltage different in value from the current threshold value for each bit containing an error (step S510) and the process of step S502 and subsequent steps are repeated.

As described above, since the error detecting operation is performed for the bit B1 group and the bit B0 group independently of each other, even when the corresponding threshold value is changed for each bit to repeat the read operation, therefore, the effect of the change on the threshold value corresponding to the other bit can be excluded.

Upon determination at step S509 by the threshold generating unit 107 that no error is contained (NO at step S509), the information is correctly read and therefore the information reading process is terminated.

As described above, with the reproducing apparatus according to the first embodiment, the error of the 2-bit information that has been read is detected for each bit, and one threshold value corresponding to each bit for determining the code stored in the memory element when an error is detected can be changed and the information can be read again. As a result, the information can be correctly read even from the memory element considerably discharged. Thus, the length of period and the number of times when the information can be read correctly can be increased.

Also, in view of the fact that a threshold value capable of reading correct information can be detected simply by changing one threshold value, an appropriate threshold value can be detected more rapidly than when all the threshold values are changed and appropriate threshold values are detected.

According to the first embodiment, one of the threshold values is fixed to "0" by use of the memory element capable of accumulating both the positive and negative charge, so that the process of determining the correct threshold value upon detection of a read error is executed at a higher speed. Nevertheless, a similar effect can be produced by fixing one threshold value even for the memory element capable of accumulating either the positive or negative charge.

In a reproducing apparatus according to a second embodiment, the charge is accumulated in the memory element in such a manner that the time before an error occurs at the time of read operation with the value of the charge amount exceeding the minimum or maximum threshold value due to discharge is longer than the time before an error occurs by exceeding the other threshold values, and upon detection of an error at the time of read operation, the minimum or maximum threshold value, as the case may be, is fixed while a new threshold value is generated thereby to read the information again.

The configuration of the reproducing apparatus according to the second embodiment is similar to that of the reproducing apparatus according to the first embodiment shown in the block diagram of FIG. 1, and therefore not explained again. The second embodiment is different from the first embodiment in the configuration of the memory elements constituting the storage unit 110.

Figure 7:
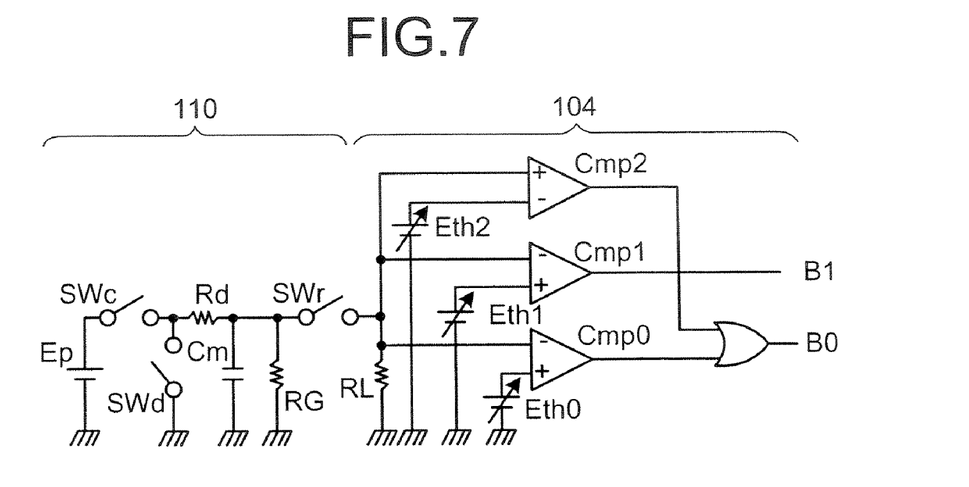
FIG. 7 is a diagram illustrating an equivalent circuit of a memory element constituting a storage unit according to a second embodiment.

FIG. 7 is a diagram illustrating an equivalent circuit of the memory element making up the storage unit 110 according to the second embodiment.

Like in the first embodiment, the right stage corresponds to an equivalent circuit of one of the comparators 104a to 104e, and the left stage corresponds to an equivalent circuit of the memory element for accumulating the charge.

As shown in FIG. 7, the memory element according to the second embodiment has only one power supply Ep. In storing the information in this memory element, the charge amount is defined as 0% for code "11," 33% for code "10," 67% for code "00," and 100% for code "01", for example, based on the voltage across the capacitor Cm in full charged state. In accordance with the code to be stored, the time of turning on the switch SWc is adjusted thereby to control the charge amount accumulated thereby to store the information.

In this way, by comparing the accumulated charge amount with the three threshold values (Eth0, Eth1, Eth2) by the comparators, the information of 2 bits B0, B1 can be output, thereby storing the four-state information (01, 00, 10, 11).

Figure 8A:
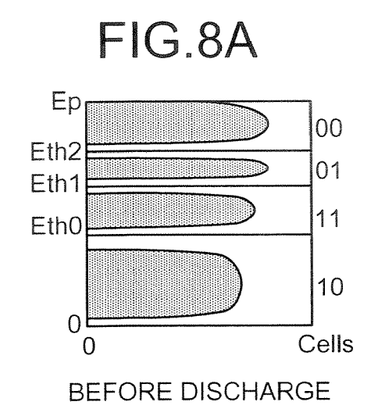
FIGS. 8A to 8C are diagrams illustrating an example of charge amount distribution of a memory element according to the second embodiment.
Figure 8B:
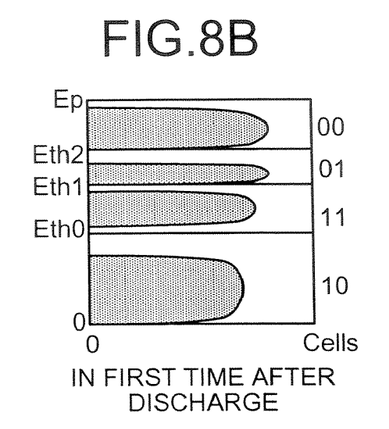
Figure 8C:
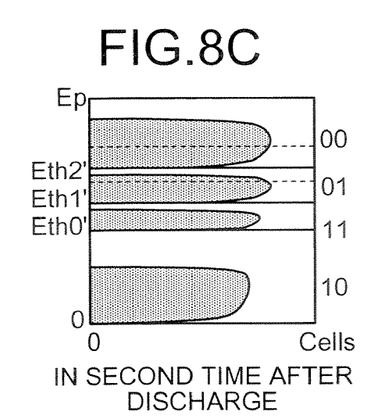

FIGS. 8A to 8C are diagrams illustrating an example of charge amount distribution of the memory elements according to the second embodiment. FIG. 8A shows the charge amount distribution immediately after the write operation; FIG. 8B shows the charge amount distribution upon lapse of a certain time; and FIG. 8C shows the charge amount upon a further lapse of time. Reference characters Eth0, Eth1, Eth2 designate the threshold values of the charge amount.

According to the second embodiment, in order to read the code while fixing Eth0, one of the threshold values to determine the bit B0, the charge is accumulated in such a manner that the difference between the charge amounts corresponding to the two codes "10" and "11" on both sides of Eth0 is big.

Thus, the time before the occurrence of an error of determining the charge amount corresponding to code "11" as code "10" with the charge amount exceeding Eth0 is longer than the time before the occurrence of a read error with the charge amount corresponding to code "01" or "00" exceeding the threshold hold Eth1 or Eth2.

Specifically, even after protracted discharge, the possibility of the output voltage exceeding Eth0 can be reduced. Upon detection of an error of bit B0, therefore, the correct threshold value can be detected by changing only the other threshold value Eth2 corresponding to bit B0.

In order to accumulate the charge so as to increase the difference between the charge amounts corresponding the two codes "10" and "11" on both sides of Eth0, the time of turning on the switch SWc at the time of writing the information is required to be adjusted appropriately.

Figure 9:
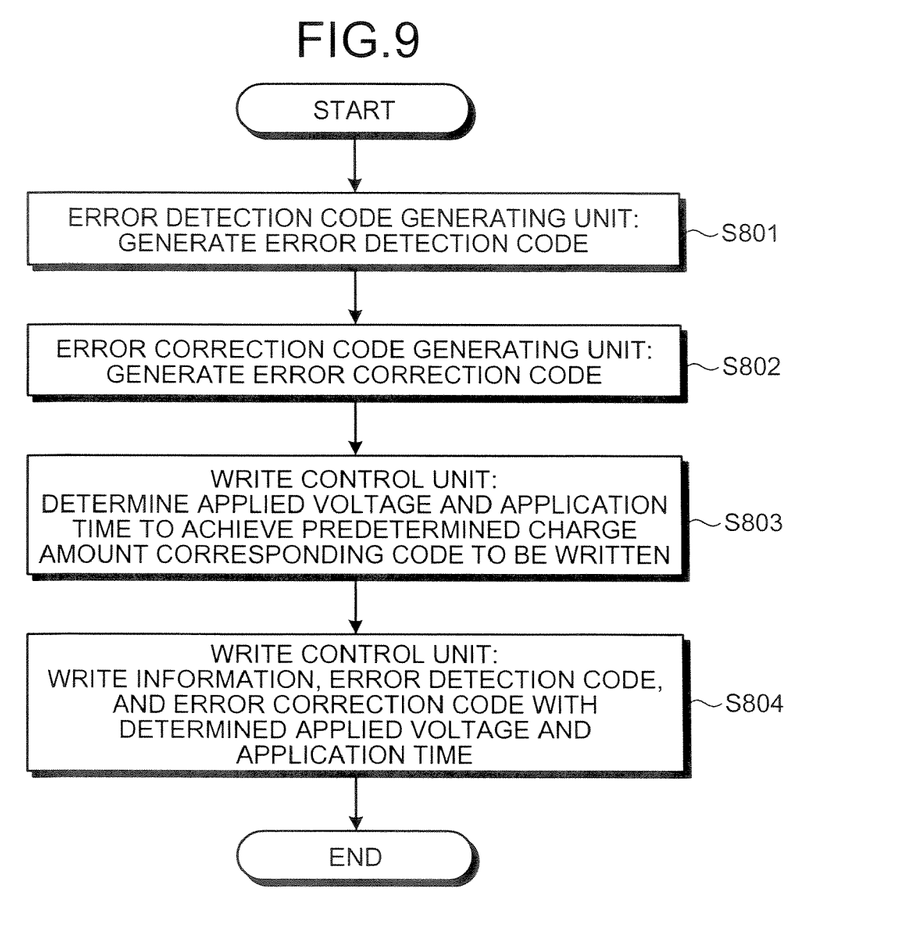
FIG. 9 is a flowchart showing the general flow of an information writing process according to the second embodiment.

An information write process by the reproducing apparatus according to the second embodiment having this configuration will be explained below. FIG. 9 is a flowchart showing the general flow of the information write process according to the second embodiment.

First, the error detection code generating unit 101 generates an error detection code for the information to be written (step S801). The error detection code generating unit 101 generates an error detection code such as the CRC 16.

Next, the error correction code generating unit 102 generates an error correction code from a combination of the information to be written and the error detection code generated by the error detection code generating unit 101 (step S802). The error correction code generating unit 102 generates an error correction code such as the BCH code or the RS code.

Then, the write control units 103a to 103e determine the applied voltage and the application time so as to reach a predetermined charge amount corresponding to the code to be written (step S803). When the applied voltage is constant, for example, the application time, i.e. the time of turning on the switch SWc is determined in such a manner that the difference between the charge amount corresponding to code "10" and the charge amount corresponding to code "11" on both sides of the threshold value Eth0 is larger than the difference of the charge amount between the codes on both sides of each of the other threshold values (Eth1, Eth2).

Next, the write control units 103a to 103e write the information, the error detection code and the error correction code in the storage unit 110 with the applied voltage and the application time thus determined (step S804) thereby to end the information write process.

Now, the information read process of the reproducing apparatus according to the second embodiment configured as described above is explained.

According to the first embodiment, upon detection of an error of bit B0, one of the threshold values for determining bit B0 is fixed to "0" and therefore the other threshold value Eth1 is changed (step S510) to perform the read operation again. Upon detection of an error in bit B1, on the other hand, the threshold value Eth0 for determining bit B1 is changed to repeat the read operation.

According to the second embodiment, in contrast, upon detection of an error in bit B0, the threshold value Eth0 constituting one of the threshold values for determining bit B0 can be handled as a fixed value, and therefore, the other threshold value Eth2 is changed to repeat the read operation, unlike in the first embodiment.

In the other respects, the information read process of the reproducing apparatus according to the second embodiment is similar to that of the first embodiment. Specifically, the general flow of the information read process according to the second embodiment is similar to that of the first embodiment shown in FIG. 6, and is not explained again.

As described above, in the reproducing apparatus according to the second embodiment, the time of applying the voltage for the information write operation and the like is adjusted to set a threshold value associated with a large difference between the charge amounts corresponding to the codes on both sides of the threshold value, i.e. a threshold value to make time before the occurrence of a read error due to discharge long, so that by fixing the particular threshold value, a threshold value with which the information can be correctly read can be detected. As compared with a case in which all the threshold values are changed to detect an appropriate threshold values, therefore, an appropriate threshold value can be detected rapidly.

The reproducing program executed in the reproducing apparatus according to the first or second embodiment is built in a ROM or the like in advance.

The reproducing program executed in the reproducing apparatus according to the first or second embodiment may be configured in the form recorded in a computer-readable storage medium such as a CD-ROM (Compact Disk Read-Only Memory), a flexible disk (FD), a CD-R (Compact Disk Recordable) or a DVD (Digital Versatile Disk) with an installable or executable format of file.

Further, the reproducing program executed in the reproducing apparatus according to the first or second embodiment may be configured in the form stored in a computer connected to a network such as the Internet and downloaded through the network. Also, the reproducing program executed in the reproducing apparatus according to the first or second embodiment may be provided or distributed through a network such as the Internet.

The reproducing program executed in the reproducing apparatus according to the first or second embodiment has configuration of module including above mentioned units (the error detection code generating unit, the error correction code generating unit, the write control unit, the comparator, the error corrector, the error detector and the threshold generating unit). And as an actual hardware, the reproducing apparatus is configured in such a manner that a CPU (Central Processing Unit) reads and executes the reproducing program from the above mentioned ROM so that each of the above mentioned units is loaded on the main storage unit and the each unit is generated on the main storage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reproducing apparatus comprising:
    a storage unit including a plurality of memory elements each capable of holding an electric charge, each memory element indicating a 2-bit code which is related to each other so that the Hamming distance between adjacent codes is unity in four ranges determined by a charge amount with respect to three threshold values with the minimum or maximum value thereof as a fixed value;
    a reading unit that reads each 2-bit code by the charge amount which is held in each memory element using the three threshold values corresponding to each memory element;
    an error detector that detects whether a first bit string consisting of right bits of the 2 bit codes read or a second bit string consisting of left bits of the 2 bit codes read has an error; and
    a threshold changing unit that, upon detection of the error, changes a threshold value corresponding to the bit string having the error other than a fixed threshold value to secure a correct bit string.

2. The reproducing apparatus according to claim 1, wherein the value of the charge amount accumulated in the storage unit after discharge is set as a minimum value or a maximum value in the storage unit.

3. The reproducing apparatus according to claim 1, wherein "0" is set as the minimum value or the maximum value in the storage unit.

4. The reproducing apparatus according to claim 1, wherein the storage unit is set so that time before the occurrence of a code read error, caused by discharge, exceeding a first threshold value that is a minimum threshold value or a maximum threshold value from the time of storing the code is longer than the time before the occurrence of a code read error exceeding other than the first threshold value from the time of storing the code.

5. The reproducing apparatus according to claim 1, wherein the threshold value changing unit changes a threshold value other than a fixed value that is a threshold value corresponding to the bit string having the error to either a value between the minimum threshold value that is a fixed value or the maximum value of the charge amount capable of being stored in the storage unit or a value between the maximum threshold value that is a fixed value and the minimum value of the charge amount capable of being stored in the storage unit.

6. The reproducing apparatus according to claim 1, wherein the threshold value changing unit changes a threshold value other than a fixed value that is a threshold value corresponding to the bit string having the error to either a value between the minimum threshold value that is a fixed value and a threshold value that is other than a fixed value larger than the threshold value to be changed or a value between the maximum threshold value that is a fixed value and a threshold value that is other than a fixed value smaller than the threshold value to be changed.

7. The reproducing apparatus according to claim 1, wherein the threshold value changing unit changes a threshold value other than a fixed value that is a threshold value corresponding to the bit string having the error to either a value between the minimum value of the charge amount capable of being stored in the storage unit and a threshold value other than a fixed value and larger than the threshold value to be changed or a value between the maximum value of the charge amount capable of being stored in the storage unit and a threshold value other than a fixed value and smaller than the threshold value to be changed.

8. The reproducing apparatus according to claim 1, wherein the threshold value changing unit changes a threshold value other than a fixed value that is a threshold value corresponding to the bit string having the error to a value having an absolute value smaller than the absolute value of the value in the first threshold group used by the reading unit to read the code.

9. The reproducing apparatus according to claim 8, wherein the threshold value changing unit changes a non-fixed threshold value corresponding to the bit string having the error to a value calculated in accordance with the discharge characteristic of the charge and having an absolute value smaller than the absolute value of the value in the first threshold group used by the reading unit to read the code.

10. A reproducing method comprising:
    reading each 2-bit code by a charge amount which is held by each of a plurality of memory elements included in a storage unit and capable of holding an electric charge, using three threshold values having a fixed minimum value or a fixed maximum value corresponding to each of the memory elements indicating the 2-bit codes related to each other so that the Hamming distance between adjacent codes is unity in four ranges determined by the charge amount with respect to the three threshold values;
    detecting whether a first bit string consisting of right bits of the 2 bit codes read or a second bit string consisting of left bits of the 2 bit codes read has an error; and
    upon detection of the error, changing a threshold value corresponding to the bit string having the error other than a fixed threshold value to secure a correct bit string.

11. A computer program product having a computer readable medium including programmed instructions for reproducing information, wherein the instructions, when executed by a computer, cause the computer to perform:
    reading each 2-bit code by a charge amount which is held by each of a plurality of memory elements included in a storage unit and capable of holding an electric charge, using three threshold values having a fixed minimum value or a fixed maximum value corresponding to each of the memory elements indicating the 2-bit codes related to each other so that the Hamming distance between adjacent codes is unity in four ranges determined by the charge amount with respect to the three threshold values;
    detecting whether a first bit string consisting of right bits of the 2 bit codes read or a second bit string consisting of left bits of the 2 bit codes read has an error; and
    upon detection of the error, changing a threshold value corresponding to the bit string having the error other than a fixed threshold value to secure a correct bit string.

* * * * *